United States Patent
Bill et al.

(10) Patent No.: US 6,430,087 B1
(45) Date of Patent: Aug. 6, 2002

(54) TRIMMING METHOD AND SYSTEM FOR WORDLINE BOOSTER TO MINIMIZE PROCESS VARIATION OF BOOSTED WORDLINE VOLTAGE

(75) Inventors: Colin S. Bill, Cupertino; Ravi P. Gutala, Milpitas, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/547,660

(22) Filed: Apr. 12, 2000

Related U.S. Application Data

(60) Provisional application No. 60/185,292, filed on Feb. 28, 2000.

(51) Int. Cl.$^7$ ................................................ G11C 16/00
(52) U.S. Cl. ............................ 365/185.23; 365/189.06; 365/189.11
(58) Field of Search ........................ 365/185.23, 185.18, 365/185.33, 189.06, 189.11

(56) References Cited

U.S. PATENT DOCUMENTS

| | | | | |
|---|---|---|---|---|
| 5,333,122 A | * | 7/1994 | Ninomiya | 365/185.23 |
| 5,453,953 A | | 9/1995 | Dhong et al. | 365/189.09 |
| 5,903,498 A | * | 5/1999 | Campardo et al. | 365/185.23 |
| 5,912,838 A | | 6/1999 | Chevallier | 365/185.03 |
| 5,946,258 A | | 8/1999 | Evertt et al. | 365/226 |
| 5,991,221 A | | 11/1999 | Ishikawa et al. | 365/226 |
| 6,084,800 A | * | 7/2000 | Choi et al. | 365/185.23 |
| 6,144,589 A | * | 11/2000 | Micheloni et al. | 365/185.23 |
| 6,181,606 B1 | * | 1/2001 | Choi et al. | 365/185.23 |

FOREIGN PATENT DOCUMENTS

| EP | 0602355 A1 | 6/1994 | ............. G05F/1/46 |
|---|---|---|---|

* cited by examiner

Primary Examiner—Tan T. Nguyen

(57) ABSTRACT

A method and system for controlling a boosted wordline voltage that is used during a read operation in a flash memory is disclosed by the present invention. In the preferred embodiment, a gate voltage is generated by a voltage booster in a wordline voltage booster circuit. An adjustable clamp circuit is electrically connected with the wordline voltage booster circuit for clamping the gate voltage that is generated by the voltage booster at a predetermined voltage level. The predetermined voltage level may be adjusted with a trimming circuit that is electrically connected to the adjustable clamp circuit, depending on process variations experienced during fabrication by the adjustable clamp circuit.

22 Claims, 2 Drawing Sheets

TRIMMING METHOD AND SYSTEM FOR WORDLINE BOOSTER TO MINIMIZE PROCESS VARIATION OF BOOSTED WORDLINE VOLTAGE

This application claims the benefit of 35 U.S.C. §119(e) of Provisional U.S. patent application Ser. No. 60/185,292, filed Feb. 28, 2000.

FIELD OF INVENTION

The present invention relates generally to non-volatile memory devices and, more particularly, to methods and systems of controlling the boosted voltage level that is applied to wordlines in flash electrically erasable programmable read-only memory (EEPROM) during read operations.

BACKGROUND OF THE INVENTION

Flash memories are popular memory storage devices because they store information in the absence of continuous power and are capable of being constructed in a very compact form. Flash memory is typically constructed by fabricating a plurality of floating-gate transistors in a silicon substrate. A floating-gate transistor is capable of storing electrical charge on a separate gate electrode, known as a floating gate, that is separated by a thin dielectric layer from a control-gate electrode. Generally speaking, data is stored in a non-volatile memory device by the storage of an electrical charge in the floating gate.

In a flash EEPROM device, electrons are transferred to the floating-gate electrode through a thin dielectric layer, known as a tunnel-oxide layer, located between the floating-gate electrode and an underlying substrate. Typically, the electron transfer is carried out by channel hot electron ("CHE") injection or Fowler-Nordheim tunneling. In either electron transfer mechanism, a voltage is coupled to the floating-gate electrode by a control-gate electrode. The control-gate electrode is capacitively coupled to the floating-gate electrode, such that a voltage applied to the control-gate electrode is coupled to the floating-gate electrode. In one type of device, the control-gate electrode is a polycrystalline silicon-gate electrode overlying the floating-gate electrode and separated therefrom by the thin dielectric layer. In another type of device, the floating-gate electrode is a doped region in the semiconductor substrate.

Flash memory is formed by rows and columns of flash transistors, with each transistor being referred to as a cell that includes a control gate, a drain and a source. A wordline decoder provides operational voltages to rows of transistors in each sector of the memory device and is typically connected with the control gate of each transistor in a sector. A bitline decoder provides operational voltages to columns of transistors and is typically connected to the drains of the transistors in each column. Generally, the sources of the transistors are coupled to a common sourceline and are controlled by a sourceline controller.

A cell is typically programmed by applying a predetermined voltage to the control gate, a second predetermined voltage to the drain, and grounding the source. This causes channel hot electrons to be injected from the drain depletion region into the floating gate. A cell can be erased several ways in a flash memory device. In one arrangement, a cell is erased by applying a predetermined voltage to the source, grounding the control gate and allowing the drain to float. This causes the electrons that were injected into the floating gate during programming to be removed by Fowler-Nordheim tunneling from the floating gate through the thin tunnel-oxide layer to the source.

Cells are typically read during a read operation by applying a predetermined threshold voltage to the control gate via a wordline, a second predetermined voltage to the bitline, to which the drain is connected, grounding the source, and then sensing the bitline current. If the cell is programmed and a threshold voltage is relatively high, the bitline current will be zero or relatively low. If the cell is not programmed or erased, the threshold voltage will be relatively low, the predetermined voltage on the control gate will enhance the channel and the bitline current will be relatively high.

Known problems occur during the read operation when a voltage applied to the wordline is not within a predetermined threshold voltage range. If the voltage applied to the wordline decoder is too high, the cells on that wordline can be physically damaged or there can be a disturbance of the threshold voltage of the cells. In addition, applying a voltage that is too high can also cause data retention failure within the cells. High voltages on the wordline can also affect the endurance of the cells on a given wordline. If the wordline voltage is too low, insufficient bitline current may be developed to properly read a cell on the wordline.

Presently known methods of supplying voltage to the wordlines during a read operation use a supply voltage (Vcc) that is typically boosted to a higher operational value during the read operation. As flash memory technology has advanced and smaller technologies have been developed (0.25 micron cell sizes), the voltage value of the supply voltage (Vcc) has been decreased from approximately 5 V to 3 V. Because of these advances, the acceptable range of voltage allowed to be supplied to the wordlines during a read operation has been reduced.

During fabrication of flash memory, even slight variations experienced during the fabrication process can cause the boosted voltage that the wordlines need to be supplied during a read operation to vary from chip to chip. The resulting wider variation of the boosted wordline voltage can be tolerated by the core cell for 0.35 micron process. However, for 0.25 micron process, where the gate-coupling of the core cells was increased, gate disturb is more likely requiring tighter control of the wordline threshold voltage level that is applied to the gates of the core cells during a read operation.

To that end, due to the further miniaturization of microchips, a need exists for methods and systems of providing tighter control of the boosted voltage level that is supplied to the wordlines during a read operation. MINIMIZE PROCESS VARIATION OF BOOSTED WORDLINE VOLTAGE

SUMMARY OF THE INVENTION

The present invention discloses a method of generating and tightly controlling a boosted wordline voltage that is used during read operations in a flash memory. In the preferred embodiment, a gate voltage is generated within a wordline voltage booster circuit that is clamped with an adjustable clamp circuit, which is electrically connected to the wordline voltage booster circuit. The adjustable clamp circuit is designed to take effect at a predetermined voltage level, which indirectly controls the voltage level of the boosted wordline voltage that is generated as an output of the wordline voltage booster circuit. A trimming circuit is electrically connected to the adjustable clamp circuit and is used to adjust the voltage level that the adjustable clamp circuit takes effect, if necessary.

The amount of voltage that is added or taken away from the voltage level that the adjustable clamp circuit takes effect at varies because of process variations experienced by the adjustable clamp circuit during fabrication. The voltage level varies because of variations in transistor sizes that are fabricated on the silicon substrate. The adjustable clamp circuit is comprised of transistors and, as such, the voltage level that the adjustable clamp circuit takes effect at is dependent on the threshold voltage (Vt) of the transistors used in the clamping path. As set forth above, since the voltage level of the boosted wordline voltage that is applied to the wordlines during read operations from the wordline voltage booster circuit is dependent on the voltage level that the adjustable clamp circuit takes effect at, the boosted wordline voltage can be adjusted to the preferred value of approximately 5.0 V by changing the voltage level at which the adjustable clamp circuit takes effect.

The preferred embodiment of the present invention allows the flash memory to maintain tight control of the boosted wordline voltage that is used during read operations, thereby increasing the reliability and durability of the flash memory. In the preferred embodiment of the present invention, the trimming circuit is electrically connected with a trimming decoder. The trimming decoder is used by the flash memory to adjust the voltage level at which the adjustable clamp circuit takes effect and, in turn, determines whether the wordlines will be exposed to a higher or lower boosted wordline voltage during operation. A plurality of content addressable memory ("CAM") circuits is electrically connected to the trimming decoder. The CAM circuits are used to control the trimming decoder, which, as set forth above, indirectly controls the voltage level at which the adjustable clamp circuit takes effect with the trimming circuit.

The output of the wordline voltage booster circuit is electrically connected to a pass gate and at least one wordline decoder. As known in the art, a typical flash memory device contains several wordline decoders that are used to transfer various operational voltage levels to selected wordlines during an operation such as read, write and erase. The pass gate is electrically connected with an enable logic circuit, which controls the pass gate by enabling and disabling the pass gate during operation. In the preferred embodiment, the pass gate is also electrically connected with a supply voltage connection (Vcc). The enable logic circuit enables the pass gate before boosting the wordlines to initiate or pre-charge the wordlines using the voltage on the supply voltage connection (Vcc) prior to boosting the wordlines to the boosted wordline voltage.

As previously set forth, the voltage level at which the adjustable clamp circuit takes effect controls the voltage level of the boosted wordline voltage that is generated by the wordline voltage booster circuit. Due to process variations experienced during fabrication, the adjustable clamp circuit may take effect at a higher or lower voltage level than the preferred value of approximately 5.0 V. As such, the voltage level at which the adjustable clamp circuit takes effect may need to be adjusted up or down, depending on the characteristics of each flash memory chip. The determination of whether the predetermined voltage level, at which the adjustable clamp circuit takes effect, needs to be adjusted is made during testing. If an adjustment is required, the CAM circuits are programmed such that the trimming decoder causes the trimming circuit to add or subtract voltage to the voltage level that the adjustable clamp circuit takes effect.

Another preferred embodiment of the present invention discloses a clamp and trimming system for controlling a boosted wordline voltage generated by a wordline voltage booster circuit in a flash memory. The clamp and trimming system includes an adjustable clamp circuit that is electrically connected with the output of a voltage booster in the wordline voltage booster circuit. The voltage booster generates a predetermined gate voltage, which is clamped by the adjustable clamp circuit at a predetermined voltage level during operation. The predetermined voltage level at which the adjustable clamp circuit takes effect controls the voltage level of the boosted wordline voltage.

A trimming circuit is electrically connected with the adjustable clamp circuit for adjusting the voltage level at which the adjustable clamp circuit takes effect, thereby controlling the voltage level of the boosted wordline voltage that is generated by the wordline voltage booster circuit. The clamp and trimming system is capable of holding and adjusting the gate voltage generated within the wordline voltage booster circuit by the voltage booster to a predetermined voltage level, which corresponds to the optimal boosted wordline voltage that needs to be applied to the wordlines during read operations in the flash memory.

As set forth above, the present invention discloses a method of controlling a boosted wordline voltage that is used during a read operation in a flash memory. In the preferred embodiment, a gate voltage is generated with a voltage booster in a wordline voltage booster circuit. The gate voltage is clamped at a predetermined voltage level with an adjustable clamp circuit that is electrically connected to the wordline voltage booster circuit. If necessary, the predetermined voltage level may be adjusted with a trimming circuit that is electrically connected to the adjustable clamp circuit. The boosted wordline voltage is then generated with the wordline voltage booster circuit based on the predetermined voltage level that the adjustable clamp circuit clamps the gate voltage of the voltage booster.

The above-referenced methods and system disclose ways of providing tight control of the boosted wordline voltage that is applied to wordlines during read operations in a flash memory. Without these methods and systems, the boosted wordline voltage could be to high or low, thereby causing problems with data retention and the overall operation of the flash memory. If the boosted wordline voltage is too low, the states of the core cells in the wordlines cannot be read properly and the flash memory will fail. If the boosted wordline voltage that is applied to the wordlines is too high, the flash memory will experience gate disturb and data retention is reduced, causing reliability problems.

These and other features and advantages of the invention will become apparent upon consideration of the following detailed description of the presently preferred embodiments of the invention, viewed in conjunction with the appended drawings.

DETAILED DESCRIPTION OF THE INVENTION

The exemplary embodiments of the invention are set forth below with reference to specific configurations, and those skilled in the art would recognize that various changes and modifications could be made on the specific configurations while remaining within the scope of the claims. The invention may be used with any type of memory device; however, the preferred embodiment of the invention is designed for a flash memory.

All electrical parameters are given by example only and can be modified to be used with various memory devices using other electrical parameters. For example, in the preferred embodiment, a supply voltage (Vcc) is considered as 3.0 V, but could alternatively be 5.0 V or some other supply voltage. If a different supply voltage is chosen, the various operational levels would be modified to accommodate the different supply voltage, as known in the art. In addition, as those skilled in the art would recognize, often the supply voltage (Vcc) varies between voltage ranges during operation due to load and various other operating parameters experienced by the system using the flash memory.

Figure 1:
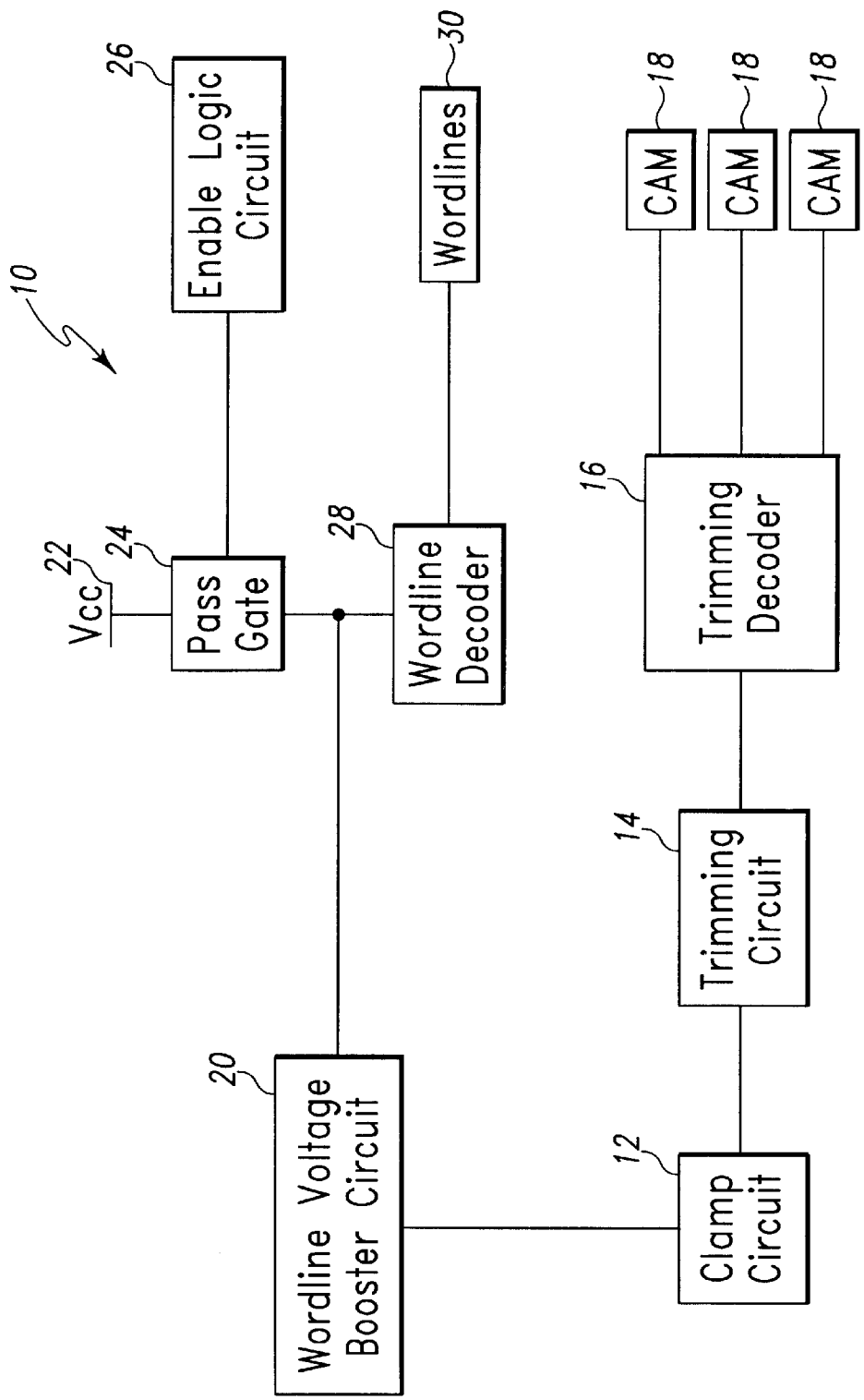
FIG. 1 represents a block diagram of a portion of a preferred flash memory incorporating a preferred embodiment of the invention.

FIG. 1 is a block diagram of a portion of a preferred flash memory 10 that incorporates a preferred embodiment of the present invention. The preferred flash memory 10 includes an adjustable clamp circuit 12, a trimming circuit 14, a trimming decoder circuit 16, at least one content addressable memory ("CAM") circuit 18, a wordline voltage booster circuit 20, a supply voltage connection (Vcc) 22, a pass gate 24, a enable logic circuit 26, a wordline decoder 28 and at least one wordline 30 electrically connected as illustrated. In the preferred embodiment of the invention, the wordline voltage booster circuit 20 is used to generate a boosted wordline voltage that is applied to the wordlines 30 during read operations.

As illustrated, the adjustable clamp circuit 12 is electrically connected to the wordline voltage booster circuit 20. The adjustable clamp circuit 12 clamps a gate voltage that is generated within the wordline voltage booster circuit 20 at a predetermined voltage level. In the preferred embodiment, the voltage level that the adjustable clamp circuit 12 takes effect at controls the voltage level of the boosted wordline voltage that is generated by the wordline voltage booster circuit 20. The adjustable clamp circuit 12 is preferentially designed to take effect at a voltage such that the boosted wordline is approximately 5.0 V; however, as set forth below, due to variations experienced during the fabrication process, the adjustable clamp circuit 12 may take effect at a higher or lower voltage level.

The voltage level at which that the adjustable clamp circuit 12 takes effect is dependent on the threshold voltage (Vt) of the periphery transistors in the flash memory 10 and, in particular, the threshold voltage (Vt) of the transistors (not illustrated in FIG. 1) used in the adjustable clamp circuit 12. The threshold voltage (Vt) of the transistors used in the periphery area of the flash memory 10 are determined during testing after fabrication, which allows a determination to be made as to what voltage level the adjustable clamp circuit 12 is taking effect and thus, the boosted wordline voltage that is being applied to the wordlines 30 during read operations. Based on this determination, the voltage level at which the adjustable clamp circuit 12 takes effect can be adjusted using the trimming circuit 14, thereby adjusting the voltage level of the boosted wordline voltage that is applied to the wordlines 30 during read operations.

The adjustable clamp circuit 12 is also electrically connected with the trimming circuit 14. The trimming circuit 14 is used to adjust the voltage level at which the adjustable clamp circuit 12 takes effect, thereby providing for adjustment of the boosted wordline voltage that is generated by the wordline voltage booster circuit 20. As set forth in greater detail below, the trimming circuit 14 is designed to add or remove a threshold voltage (Vt) from the clamping path that is created by the adjustable clamp circuit 12, thus changing the voltage level at which the adjustable clamp circuit 12 takes effect.

The trimming circuit 14 is also electrically connected with the trimming decoder 16. The trimming decoder 16 controls the amount of voltage the trimming circuit 14 adds or subtracts from the voltage level at which the adjustable clamp circuit 12 takes effect. The trimming decoder 16 is electrically connected with the CAM circuits 18, which are programmed to control the trimming decoder 16. The CAM circuits 18 are programmed during testing to control the amount of voltage the trimming decoder 16 causes the trimming circuit 14 to. add or subtract from the voltage level at which the adjustable clamp circuit 12 takes effect.

As further illustrated in FIG. 1, the output of the wordline voltage booster circuit 20 is electrically connected with the pass gate 24 and the wordline decoder 28. The pass gate 24 is electrically connected with the supply voltage connection (Vcc) 22 and the enable logic circuit 26. The pass gate 24 is controlled by the enable logic circuit 26, which enables the pass gate 24 before boosting the wordlines 30 with the boosted wordline voltage generated by the wordline voltage booster circuit 20. This is done to initiate, or pre-charge, the wordlines 30 with the voltage level available on the supply voltage connection (Vcc) 22 prior to applying the boosted wordline voltage to the wordlines 30.

The wordline decoder 28 is electrically connected with the wordline voltage booster circuit 20 and the pass gate 24. The wordline decoder 28 is also electrically connected with the wordlines 30 and is used to transfer or pass the boosted wordline voltage that is generated by the wordline voltage booster circuit 20, and controlled by the adjustable clamp circuit 12, to selected wordlines 30 during read operations. The wordline decoder 28 is also used to pass or transfer the supply voltage on the supply voltage connection (Vcc) 22 to the wordlines 30. When the pass gate 24 and predetermined wordline decoders 28 are enabled, the voltage on the supply voltage connection (Vcc) 22 is transferred to the wordlines 30 to pre-charge the wordlines 30 before the boosted wordline voltage is applied.

The wordline voltage booster circuit 20 is used by the flash memory 10 to generate the boosted wordline voltage that is applied to the wordlines 30 during read operations. In the preferred embodiment of the present invention, the wordline voltage booster circuit 20 preferentially boosts the magnitude of voltage on the supply voltage connection (Vcc) 22 from approximately 3.0 V to approximately 5.0 V. The adjustable clamp circuit 12 is optimally designed to take effect at approximately 3.3 V, thus causing the boosted wordline voltage that is generated by the wordline voltage booster circuit 20 to be set at approximately 5.0 V.

As previously set forth, due to variations in the fabrication process, the adjustable clamp circuit 12 may take effect at a higher or lower voltage and, as such, the voltage level that the adjustable clamp circuit 12 takes effect at may need to be adjusted with the trimming circuit 14. As previously set forth, the voltage level of the boosted wordline voltage is dependent on the voltage level at which the adjustable clamp circuit 12 takes effect. Since variations in the fabrication process can cause the adjustable clamp circuit 12 to take effect at a higher or lower voltage level causing the optimal boosted wordline voltage level of approximately 5.0 V to change, the trimming circuit 14 is used to raise or lower the voltage level at which the adjustable clamp circuit 12 takes effect. As such, the adjustable clamp circuit 12 is preferentially adjusted by the trimming circuit 14 to take effect at a voltage level that will cause the boosted wordline voltage generated by the wordline voltage booster circuit 20 to be set at approximately 5.0 V.

As previously set forth, in prior art flash memory that use 0.35 micron process manufacturing technology, a wider variation in the boosted wordline voltage generated by the wordline voltage booster circuit 20 could be tolerated by the core cells in the wordlines 30. Since the core cells in the wordlines 30 could tolerate a wider variation in the voltage level of the boosted wordline voltage, a need did not exist to tightly control the magnitude of voltage that was generated by the wordline voltage booster circuit 20 and ultimately supplied to the wordlines 30 during read operations. For flash memory that use 0.25 micron process technology, where the gate coupling of the flash transistors is increased, gate disturb is more likely, thereby requiring a tighter control of the boosted wordline voltage that is generated by the wordline voltage booster circuit 20 and supplied to the wordlines 30 during read operations.

As illustrated in FIG. 1, the adjustable clamp circuit 12 is electrically connected with the trimming circuit 14. In the preferred embodiment, the trimming circuit 14 can add or take away at least one threshold voltage (Vt) from the clamping path that is created by the adjustable clamp circuit 12. The determination of the voltage level at which the adjustable clamp circuit 12 takes effect is made during testing of the flash memory 10 after fabrication. If the adjustable clamp circuit 12 is taking effect at a higher voltage level than necessary, the trimming circuit 14 can take away a threshold voltage (Vt) from the clamping path, thereby lowering the voltage level at which the adjustable clamp circuit 12 takes effect. In the alternative, if the adjustable clamp circuit 12 is determined during testing to be taking effect at a lower voltage level than required, the trimming circuit 14 can add a threshold voltage (Vt) to the clamping path, thereby raising the voltage level at which the adjustable clamp circuit 12 takes effect. As such, the boosted wordline voltage that is generated by the wordline voltage booster circuit can be adjusted if necessary.

In the preferred embodiment of the present invention, the amount of adjustment made to the adjustable clamp circuit 12 by the trimming circuit 14 is controlled by the trimming decoder 16. The trimming decoder 16 is controlled by the CAM circuits 18, which, as previously set forth, are programmed during testing. The adjustable clamp circuit 12 is preferentially set up to take effect at a voltage level optimal for reading the flash transistors in the wordlines 30, which as previously set forth, is known to be approximately 5.0 V. The CAM circuits 18 are programmed after a determination has been made as to what the status is of the process variable in the threshold voltages (Vt) of transistors in the adjustable clamp circuit 12. As such, the CAM circuits 18 and the trimming decoder 16 control the amount of voltage that is added or taken away from the voltage level at which the adjustable clamp circuit 12 takes effect.

Figure 2:
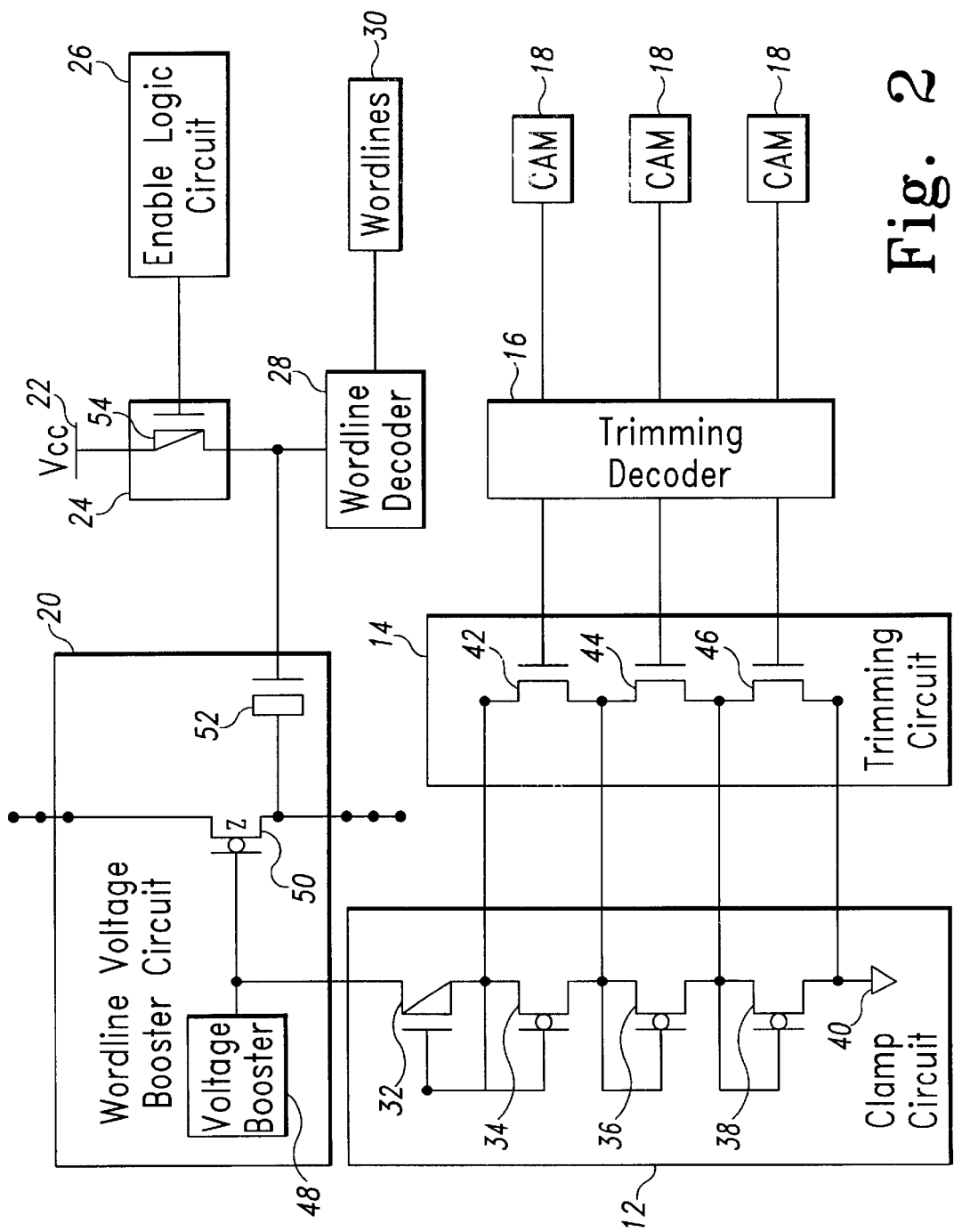
FIG. 2 illustrates a more detailed block diagram of the preferred flash memory illustrated in FIG. 1 and sets forth a circuit schematic of the preferred adjustable clamp circuit and trimming circuit.

As illustrated in FIG. 2, the preferred adjustable clamp circuit 12 includes a p-channel transistor 32, a plurality of n-channel intrinsic transistors 34, 36, 38 and a ground connection 40 that are electrically connected as illustrated. The adjustable clamp circuit 12 takes effect once the gate voltage that is generated within the wordline voltage booster circuit 20 reaches a predetermined voltage level. As previously set forth, the voltage level at which the adjustable clamp circuit 12 takes effect is controlled by the trimming circuit 14. The voltage level at which the adjustable clamp circuit 12 takes effect is also determined by the clamping path created by the threshold voltage (Vt) of p-channel transistor 32 and n-channel intrinsic transistors 34, 36, 38, which can be determined by reading out the threshold voltages (Vt) of these devices during testing.

Due to process variations during manufacturing, the threshold voltage (Vt) of the transistors fabricated in the periphery area of the flash memory 10 will vary to some degree. The adjustable clamp circuit 12 and the wordline voltage booster circuit 20 are located in the periphery area. As previously set forth, the voltage level at which the adjustable clamp circuit 12 takes effect is dependent on the threshold voltage (Vt) of the clamping path created by transistors 32, 34, 36 and 38. As such, since the threshold voltage (Vt) of transistors 32, 34, 36 and 38 in the adjustable clamp circuit 12 will vary because of variations experienced during fabrication, the voltage level at which the adjustable clamp circuit 12 takes effect can vary based on these process variations.

As further illustrated in FIG. 2, the trimming circuit 14 consists of a plurality of n-channel transistors 42, 44, 46 that are electrically connected as illustrated. The trimming decoder 16 is electrically connected to the gates of each respective n-channel transistor 42, 44, 46 in the trimming circuit 14. In addition, the drains and sources of each respective n-channel transistor 42, 44, 46 in the trimming circuit 14 are electrically connected to the respective drains and sources of a respective n-channel intrinsic transistor 34, 36, 38 in the adjustable clamp circuit 12, as depicted in FIG. 2. When the flash memory 10 is tested after the fabrication process, the CAM circuits 18 can be programmed to cause the trimming decoder 16 to enable or disable respective n-channel transistors 42, 44, 46 in the trimming circuit 14, thus changing the voltage level at which the adjustable clamp circuit 12 takes effect.

If a respective n-channel transistor 42, 44, 46 is enabled in the trimming circuit 14, the respective n-channel intrinsic transistor 34, 36, 38 in the adjustable clamp circuit 12 that is connected with the enabled n-channel transistor 42, 44, 46 is shorted out. By shorting out respective n-channel transistors 34, 36, 38, a threshold voltage (Vt) level drop across the n-channel intrinsic transistor 34, 36, 38 is removed from the clamping path created by the adjustable clamp circuit 12. As a result, the voltage level at which the adjustable clamp circuit 12 takes effect can be reduced or increased by removing or adding a threshold voltage (Vt) drop across respective n-channel intrinsic transistors 34, 36, 38 in the clamping path of the adjustable clamp circuit 12.

As illustrated in FIG. 2, the preferred wordline voltage booster circuit 20 includes a voltage booster 48, a zero threshold transistor 50 and a boost capacitor 52. The voltage booster 48 is used to boost the voltage level available on the supply voltage connection (Vcc) 22, which can vary from approximately 2.7 V–3.6 V, to approximately 5.0 V. Voltage boosters are known in the art and a detailed discussion of the circuitry used in the voltage booster 48 is not necessary for an understanding of the present invention. For the purpose of the present invention, it is only necessary to understand that the voltage booster 48 is preferentially designed to boost the voltage available on the supply voltage connection (Vcc) 22 to a boosted wordline voltage of approximately 5.0 V.

As illustrated in FIG. 2, the source of p-channel transistor 32 in the adjustable clamp circuit 12 is electrically connected with the output of the voltage booster 48. Since the adjustable clamp circuit 12 is electrically connected with the output of the voltage booster 48, the adjustable clamp circuit 12 is able to clamp the gate voltage that is generated by the voltage booster 48 at the predetermined voltage level at which the adjustable clamp circuit 12 is set up to-take effect. As known in the art, clamps are used to fix or hold the operation of a particular device at a predetermined dc voltage level.

The output of the voltage booster 48 is also electrically connected with gate of zero threshold transistor 50. The source of zero threshold transistor 50 is electrically connected with the boost capacitor 52, which, is in turn, electrically connected with the pass gate 24 and the wordline decoder 28. For the purpose of the present invention, it is only necessary to understand that zero threshold transistor 50 of the wordline voltage booster circuit 20 is used to pass the voltage generated by the voltage booster 48 to the boost capacitor 52 during read operations. As such, zero threshold transistor 50 acts as a source follower in the preferred embodiment, passing the gate voltage zero threshold transistor 50 to the source of zero threshold transistor 50, which in turn, passes the voltage to the boost capacitor 52. In the preferred embodiment, the adjustable clamp circuit 12 controls the size of the voltage boost that the boost capacitor 52 experiences, which in turn, indirectly controls the boosted wordline voltage that is applied to the wordlines 30 during read operations.

As further illustrated in FIG. 2, in the preferred embodiment of the present invention, the pass gate 24 comprises a p-channel transistor 54. The source of p-channel transistor 54 is electrically connected with the supply voltage connection (Vcc) 22 and the drain of p-channel transistor 54 is electrically connected with boost capacitor 52 and the wordline decoder 28. During operation, the pass gate 24 is enabled by the enable logic circuit 26 so that the voltage available on the supply voltage connection (Vcc) 22 initiates or pre-charges the wordlines 30 before the boosted wordline voltage that is generated by the wordline voltage booster circuit is transferred to the wordlines 30, as previously set forth.

As known in the art, the wordline decoder 28 is used to transfer various operational voltages to the wordlines 30 during operation of the flash memory 10. The wordline decoder 28 is electrically connected with the boost capacitor 52 and the pass gate 24. Wordline decoders are known in the art and a detailed discussion of the circuitry makeup of wordline decoders is not necessary for an understanding of the present invention. For the purpose of the present invention, it is only necessary to understand that wordline decoder 28 is capable of transferring the boosted wordline voltage that is generated with the wordline voltage booster circuit 20 to the wordlines 30 during read operations.

As set forth above, the present invention discloses a method of reducing the process sensitivity of flash memory 10, thereby increasing yields from the manufacturing process. To reduce the process sensitivity, the adjustable clamp circuit 12 is designed to self-compensate for changes in the threshold voltage (Vt) of transistors 32, 34, 36 and 38 in the adjustable clamp circuit 12. The adjustable clamp circuit 12 is capable of self-compensating because p-channel transistor 32 is electrically connected in series with n-channel intrinsic transistor 34; and, as known in the art, as one threshold voltage (Vt) increases, the other will decrease. In addition, with the addition of the trimming circuit 14, the preferred flash memory 10 is capable of adding or taking away an intrinsic threshold voltage (Vt) in the clamping path, thereby changing the voltage level at which the adjustable clamp circuit 12 takes effect and, in turn, determines if the wordlines 30 are clamped at a higher or lower boosted wordline voltage during read operations.

For a fabrication process that produces a batch of flash memory 10 where the threshold voltage (Vt) of transistors 32, 34, 36 and 38 in the adjustable clamp circuit 12 has increased, the wordline voltage booster circuit 20 will boost higher because of the increase in the threshold voltage (Vt) of transistors 32, 34, 36 and 38. As such, the gate voltage that is generated by the voltage booster 48 will need to be lowered to provide the optimal boosted wordline voltage. To lower the voltage level at which the adjustable clamp circuit 12 takes effect, an intrinsic threshold voltage (Vt) can be removed from the clamping path with the trimming circuit 14, which shorts out a respective n-channel intrinsic transistor 34, 36, 38 in the adjustable clamp circuit 12. This is done by removing an intrinsic transistor diode in n-channel transistors 34, 36, 38 using a respective n-channel transistor 42, 44, 46 in the trimming circuit 14.

In the alternative, for a fabrication process that produces a batch of flash memory 10 where the threshold voltage (Vt) of transistors 32, 34, 36 and 38 in the adjustable clamp circuit 12 has decreased, the wordlines 30 will boost lower because the adjustable clamp circuit 12 will take effect at a lower gate voltage from the voltage booster 48. As such, the voltage level at which the adjustable clamp circuit 12 takes effect will need to be raised to provide the optimal boosted wordline voltage. To raise the voltage level at which the adjustable clamp circuit takes effect respective n-channel intrinsic transistors 34, 36, 38 are not shorted out in the adjustable clamp circuit 12 with the n-channel transistors 42, 44, 46 of the trimming circuit 14. Therefore, the present invention is capable of compensating for process variation experienced during fabrication by adjusting and maintaining tight control of the boosted wordline voltage that is applied to wordlines 30 during read operations.

Although the detailed description describes preferred embodiments using a flash EPROM, the invention may be used with any nonvolatile writeable memory, including, but not limited to, EPROMs, EEPROMs, and flash memories, including technologies such as NOR, NAND, AND, Divided bit-line NOR (DINOR), and Ferro-electric Random Access Memory (FRAM). While the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. A method of controlling a boosted wordline voltage used during a read operation in a flash memory, comprising the steps of:

generating a gate voltage with a voltage booster in a wordline voltage booster circuit;

clamping said gate voltage at a predetermined voltage level with an adjustable clamp circuit electrically connected to said wordline voltage booster circuit, wherein said predetermined voltage level may be adjusted with a trimming circuit electrically connected to said adjustable clamp circuit; and generating said boosted wordline voltage based on said predetermined voltage level with said wordline voltage booster circuit.

2. The method of claim 1, further comprising the step of transferring said boosted wordline voltage to at least one wordline.

3. The method of claim 2, wherein said boosted wordline voltage is transferred to said wordline with a wordline decoder.

4. The method of claim 1, wherein said trimming circuit is electrically connected with a trimming decoder for controlling the voltage adjustment made by said trimming circuit.

5. The method of claim 4, wherein said trimming circuit is electrically connected with at least one content addressable memory circuit for controlling said trimming decoder.

6. The method of claim 1, wherein said adjustable clamp circuit comprises a p-channel transistor, a plurality of n-channel intrinsic transistors and a ground connection.

7. The method of claim 6, wherein said trimming circuit adjusts said predetermined voltage by shorting out respective n-channel intrinsic transistors in said adjustable clamp circuit.

8. The method of claim 1, wherein said trimming circuit comprises a plurality of n-channel transistors.

9. A clamp and trimming system for controlling a boosted wordline voltage generated by a wordline voltage booster circuit in a flash memory, comprising:

an adjustable clamp circuit electrically connected with the output of a voltage booster in said wordline voltage booster circuit wherein said adjustable clamp circuit takes effect at a predetermined voltage level that controls the voltage level of said boosted wordline voltage; and a trimming circuit electrically connected with said adjustable clamp circuit for adjusting said predetermined voltage level.

10. The clamp and trimming system of claim 9, further comprising a wordline decoder electrically connected to said wordline voltage booster circuit and at least one wordline, wherein said wordline decoder transfers said boosted wordline voltage to a respective wordline.

11. The clamp and trimming system of claim 9, further comprising a trimming decoder electrically connected to said trimming circuit, wherein said trimming decoder controls the amount of voltage adjustment made by said trimming circuit.

12. The clamp and trimming system of claim 9, further comprising at least one content addressable memory circuit electrically connected with said trimming decoder, wherein said at least one content addressable memory circuit controls said trimming decoder.

13. The clamp and trimming system of claim 9, wherein said adjustable clamp circuit comprises a p-channel transistor, a plurality of n-channel intrinsic transistors and a ground connection.

14. The clamp and trimming system of claim 13, wherein said trimming circuit shorts out a respective n-channel intrinsic transistor in said adjustable clamp circuit to adjust said predetermined voltage level.

15. The clamp and trimming system of claim 9, wherein said trimming circuit comprises a plurality of n-channel transistors that are electrically connected with said adjustable clamp circuit.

16. A method of boosting wordlines during a read operation in a flash memory, comprising the steps of:

generating a gate voltage with a voltage booster in wordline voltage booster circuit;

clamping said gate voltage at a predetermined voltage level with an adjustable clamp circuit that is electrically connected with the output of said voltage booster;

adjusting the predetermined voltage level at which said adjustable clamp circuit takes effect with a trimming circuit that is electrically connected with said adjustable clamp circuit;

generating a boosted wordline voltage with said wordline voltage booster circuit that is dependent on said predetermined voltage level; and transferring said boosted wordline voltage to at least one wordline with a wordline decoder that is electrically connected with said wordline voltage booster circuit.

17. The method of claim 16, further comprising the step of pre-charging said wordlines with the voltage on a supply voltage connection before boosting said wordlines with said boosted wordline voltage.

18. The method of claim 16, further comprising the step of using a trimming decoder to control the amount of adjustment made by said trimming circuit.

19. The method of claim 18, further comprising the step of controlling said trimming decoder with at least one content addressable memory circuit.

20. The method of claim 16, wherein said adjustable clamp circuit comprises a p-channel transistor, a plurality of n-channel intrinsic transistors and a ground connection.

21. The method of claim 20, wherein said trimming circuit adjusts said predetermined voltage level by shorting out respective n-channel intrinsic transistors in said adjustable clamp circuit.

22. The method of claim 16, wherein said trimming circuit comprises a plurality of n-channel transistors.

* * * * *